United States Patent [19]
Flanagin et al.

[11] Patent Number: 4,646,322
[45] Date of Patent: Feb. 24, 1987

[54] ADAPTIVE DELTA MODULATION CODEC

[75] Inventors: Stephen D. Flanagin, Santa Monica; John C. Gord, Venice, both of Calif.

[73] Assignee: Telex Computer Products, Inc., Tulsa, Okla.

[21] Appl. No.: 562,623

[22] Filed: Dec. 19, 1983

[51] Int. Cl.<sup>4</sup> ............................................. H03M 7/38
[52] U.S. Cl. ...................................... 375/27; 375/30; 375/32; 364/724
[58] Field of Search ....................... 375/27, 28, 30, 32; 332/11 D; 364/724, 728

[56] References Cited
U.S. PATENT DOCUMENTS

| 3,609,551 | 9/1971 | Brown | 375/32 |
| 3,757,252 | 9/1973 | Deschenes et al. | 375/32 |
| 3,878,465 | 4/1975 | Stéphenne et al. | 375/30 |
| 3,882,426 | 5/1975 | Hoeschele, Jr. | 375/30 |
| 3,899,754 | 8/1975 | Brolin | 375/32 |
| 4,042,921 | 8/1977 | Smith | 375/30 |

OTHER PUBLICATIONS

"Logarithmic Digital Compandor for Delta Modulation", D. L. Henry, *IBM Technical Disclosure Bulletin*, vol. 17, No. 3, Aug. 1974, pp. 909–910.

Primary Examiner—Robert L. Griffin
Assistant Examiner—Raymond C. Glenny
Attorney, Agent, or Firm—Head, Johnson & Stevenson

[57] ABSTRACT

An ADM codec includes CVSD encoder and decoder circuitry having a syllabic filter responsive to the binary state of the ADM bit samples for changing the quantization step amplitude at a rate of change directly proportional to the rate of change of slope of the received voice signal.

4 Claims, 8 Drawing Figures

ADAPTIVE DELTA MODULATION CODEC

TECHNICAL FIELD

This invention relates to adaptive delta modulation (ADM) codecs, and more particularly to continuously variable slope delta modulation (CVSD) type ADM codecs.

BACKGROUND ART

Delta modulation (DM) is a known codec technique for digitally encoding/decoding analog voice signals. It exploits the sample-to-sample redundancy of the speech waveform. Successive single bit samples are made of the difference signal magnitude between the actual voice signal and an approximation of the voice waveform produced by integrating associated quantized sample step voltage signals. The binary state of the samples indicate whether the difference signal has increased or decreased and are used to control the polarity of the quantized step signals to allow the approximation to track the actual voice signal. The sample bit code may then be decoded to reconstruct the voice waveform by using the sample bits to control the step polarity of a second, identical integrating circuit.

In adaptive delta modulation (ADM) codecs the amplitude as well as the polarity of the integrated step voltage is varied algorithmically as a function of the difference signal magnitude. The purpose is to make the height (H(t)) of the step voltage V(t) large when the difference signal magnitude is large voice signal slope is steep) and small when the (slope is small). This allows the approximation to track the input over a wide range of input levels, providing a higher signal-to-noise (S/N) ratio by minimizing distortion due to slope overload noise (approximation falls more than a step size behind the voice signal) and quantization noise (proportional to square of the step size). Since voice signal slope varies with syllable generation this ADM technique is also known as syllable companding.

One type of syllabic companding used in telephony applications for handling a wide dynamic range of speech signals is continuously variable slope delta modulation (CVSD). In CVSD systems the step voltage amplitude is varied as a function of the short term average of the slope amplitude information, which is derived from the sample bit stream. Successive equal state bit samples, i.e. "coincidence" indicate rapid slope change, typically successive logic ones indicate rapid positive slope and logic zeros indicate a rapid negative slope. The bit samples are integrated in an UP/DOWN counter to provide a present sample interval bit state count, i.e. a binary signal count S(t). The step height in each sample interval is the product of the particular interval binary signal count and the selected algorithm ($V_o$) of a syllabic filter.

In prior art CVSD codecs the step height is either increased directly with the binary signal count S(t) as $V(t) = V_o * S(t)$ or as the product of the count and a first order lag, e.g. $V(t) = V_o * S(t) \, 1 - e^{-t/RC}$. Typically the prior art codec encoder and decoder circuitry is built around proprietary integrated circuit CVSD encoders, such as the Harris HC-5516/55532 or Motorola MC 3417/3418 CVSD. The binary signal S(t) sets different fixed step sizes based on the presence or absence of binary state coincidence. For steep voice signal slopes $V_o * S(t) = V_H$, otherwise $V_o * S(t) = V_L$ which is less than $V_H$ but the same polarity. The set step is then integrated through an RC filter, e.g. $V(t) = V_H (1 - e^{-t/RC})$.

The RC time constant is empirically set in dependence on syllabic duration, and controls the rate of change in value of the step as $$\frac{dV(t)}{dt} = \frac{VH}{RC} * e^{-t/RC};$$

for a slow changing voice signal slope the change in step size is rapid whereas for rapid slopes the step rate of change is insignificant. In effect the rate of step change is inversely proportional to the step amplitude setting. This produces undesirable S/N ratios over the range of input signal magnitudes, such as during idle, due to quantization and slope overload noise. Ideally the rate of change in step amplitude should follow the rate of change in voice signal slope.

DISCLOSURE OF INVENTION

One object of the present invention is to provide an improved ADM codec with higher S/N ratio CVSD encoding/decoding. Another object is to provide a high fidelity syllabic filter in which the rate of change in quantization step amplitude follows the rate of change in voice signal slope.

According to the present invention an improved ADM codec includes CVSD encoder and decoder circuitry having a syllabic filter responsive to the binary state condition of the sample bit stream for changing the step amplitude at a rate of change directly proportional to the set amplitude of the step voltage. In further accord with the present invention the codec syllabic filter increases and decreases the step amplitude in response to increasing and decresing difference signal magnitude in an $e^{+ks}$ and $e^{-ks}$ manner, whereby the instantaneous rate of change in step voltage amplitude is equal to the product of a constant times the instantaneous step amplitude.

In still further accord with the present invention a syllabic filter includes an up/down binary counter responsive at the up input to the occurrence of successive equal binary state sample signals and at the down input to a duty cycle clock count which is directly proportional to the counter output state to provide a binary multiplied count output characterized by up counts in a steep voice slope condition and down counts at all other times, the binary count output being presented to a nonlinear digital to analog (D/A) converter which provides an exponential step amplitude characteristic which is integrated and filtered to provide the voice approximation signal.

These and other objects, features and advantages of the present invention will become apparent in light of the following detailed description of a best mode embodiment thereof, as illustrated in the accompanying drawing.

BRIEF DESCRIPTION OF DRAWINGS(S)

BEST MODE FOR CARRYING OUT THE INVENTION

Figure 3:
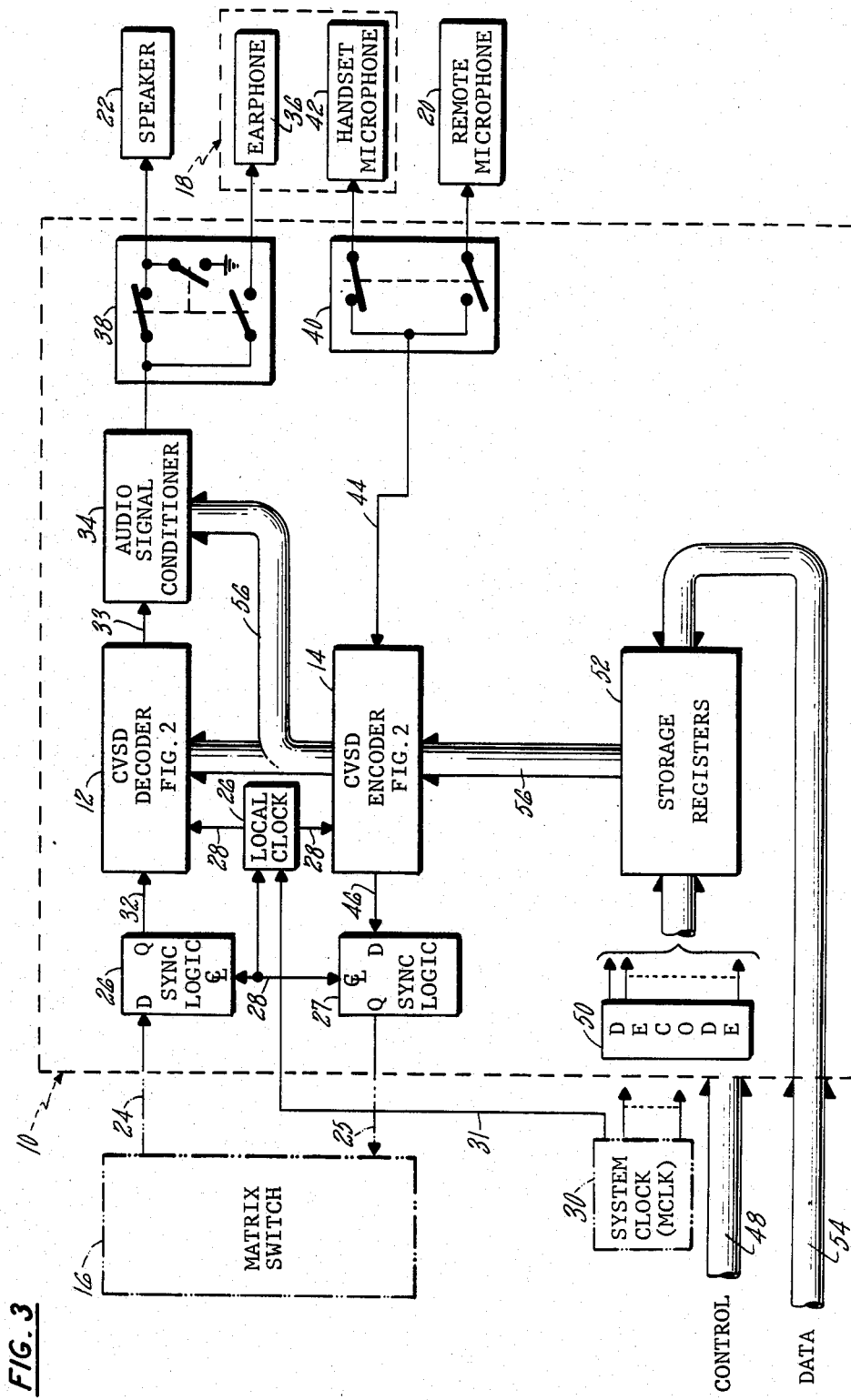
FIG. 3 is a simplified system block diagram of a CODEC in which the syllabic filter and encoder of FIGS. 1, 2 may be used.
Figure 6:
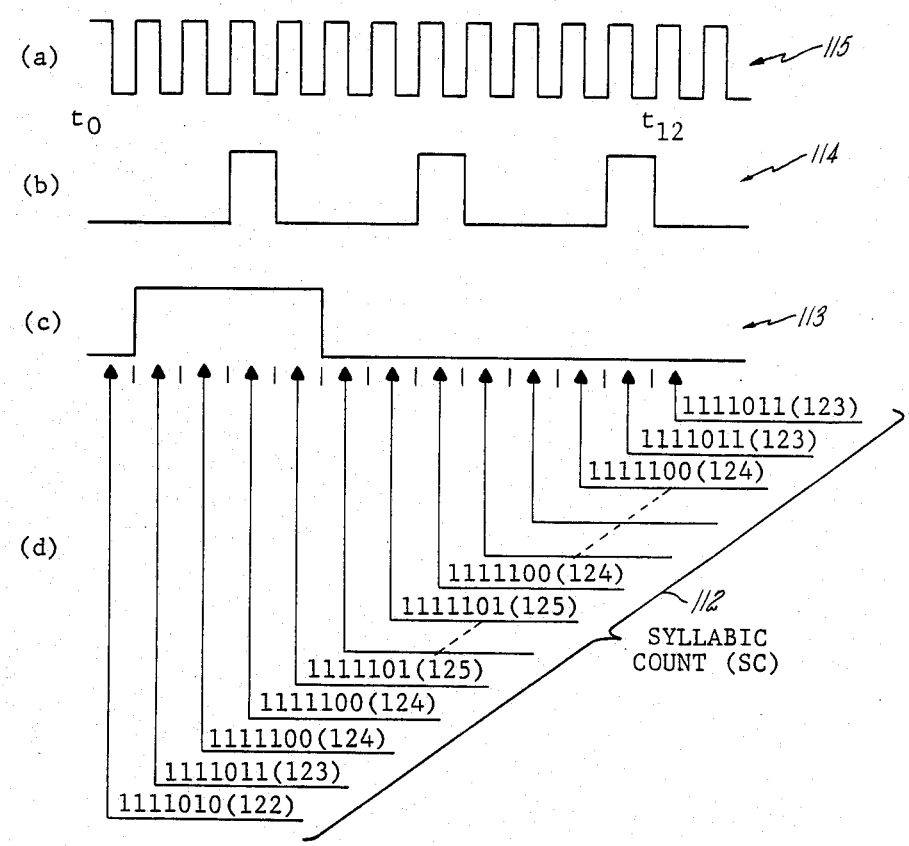
FIG. 6 is an illustration of another set of waveforms used in the description of the present invention.

Referring first to FIG. 3, in a simplified system block diagram of a CVSD CODEC 10 according to the present invention, a CVSD decoder 12 and encoder 14 provide D/A and A/D conversions of voice information between a central matrix switch 16 and the CODEC station equipment e.g. handset 18, remote microphone 20 and speaker 22. The CODEC is of the type which may be used in the telephone private branch exchange (PBX) of the type disclosed in copending applications of the same assignee entitled: PBX TELEPHONE SYSTEM I/O INTERFACE, Flanagin et al, Ser. No. 432,882 filed Oct. 5, 1982, and PBX TELEPHONE SYSTEM REMOTE SYNCHRONIZATION, Flanagin et al, Ser. No. 432,884 filed Oct. 5, 1982. The illustration of FIG. 3 has been greatly simplified with respect to the CODEC peripheral equipment; all of which is well known and not essential to an understanding of the invention. FIG. 6 and associated text of the above copending application's specifications describe in detail the station equipment peripheral to the CODEC.

Briefly, in operation the CODEC (through framing circuitry not shown) communicates with the PBX matrix switch in serial bit format over lines 24, 25. The CODEC I/0 bit synchronization is provided through flip-flops 26, 27 which are strobed by the CODEC local clock 26 through lines 28; the clock is synched to a system master clock (MCLK) 30 through line 31. The synched digital signal on line 3Z from flip-flop 26 is decoded to an analog signal on the line 33. Signal conditioner 34 provides a selected audio level output for the analog signal, which is provided to the handset earphone 36 or speaker 22 through function select switches 38.

On the transmit side the analog voice band signal is presented through function switches 40 from either the handset microphone 42 or remote microphone 20. The selected analog source output is presented on line 44 to the CVSD encoder 14 which encodes the analog voice signal into the serial stream of ADM sample bits provided on line 46 to flip-flop 27. In the preferred embodiment the audio signal ADM samples are encoded at a 56 kHz rate and shifted out at a 64 kHz rate to permit insertion of one bit of digital data after every seven bits of ADM data.

CODEC control is provided by associated order wire circuitry (not shown) within the station equipment. The control signals are provided through lines 48 and control decode circuitry 50 to storage registers 52. Data to the CODEC, e.g. control data related to gain level or interconnect info, is provided on lines 54 from the order wire circuitry and stored in the registers until needed. The control and data outputs from the storage registers are provided on lines 56 to the encoder, decoder, and audio signal conditioner.

Figure 2:
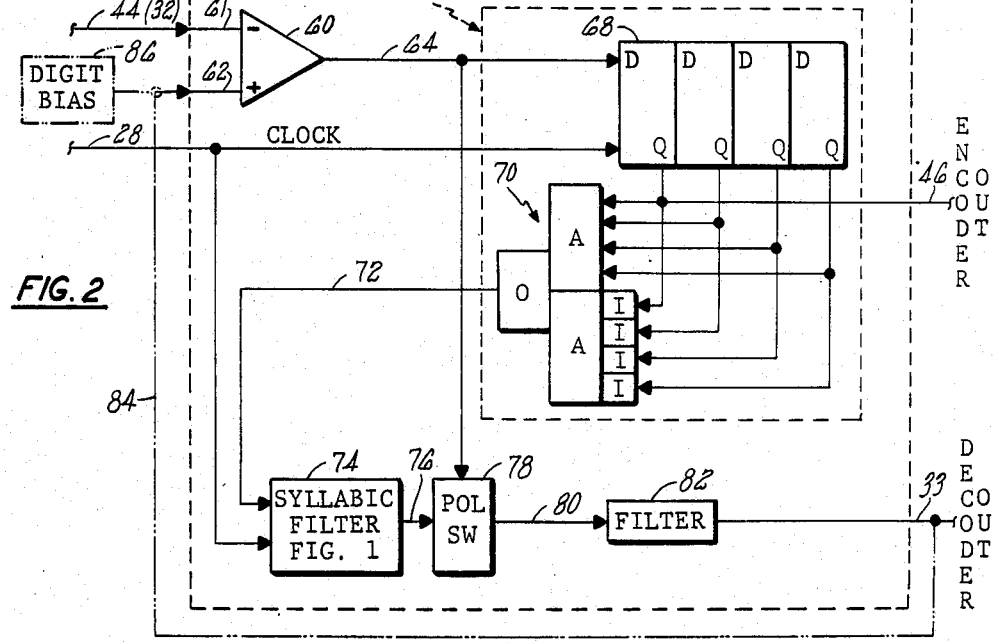
FIG. 2 is a system block diagram of a CVSD encoder in which the syllabic filter of FIG. 1 may be used.

FIG. 2 is a block diagram of common CVSD encoder 14/decoder (12) circuitry 58 which may be used in the CODEC of FIG. 3. As shown, the encoder and decoder may have the same architecture which is "programmed" for the particular encoder/decoder function by changing external connections. It should be understood, however, that the use of such common circuitry is optional, and is only illustrative of one common configuration which may be used. There are various other configurations for the encoder and decoder functions which may be suitable, as known to those skilled in the art.

The illustrated encoder/decoder architecture includes a comparator 60 with inverting and noninverting inputs 61, 62, and an output connected through line 64 to a coincidence detector 66. The series binary bit output (ADM sample bits) from the comparator is the ADM encoded voice signal which is strobed into a multiple bit shift register 68 by the clock signal on line 28. In a preferred embodiment the coincidence detector has a four bit register and the clock is 56 KHz. The first register output on line 46 is the encoder/decoder ADM output. The content of the four bit register is monitored by the illustrated combination AND (A), OR (0), and INVERT (I) logic circuitry 70 for the presence of four bit coincidence (ones or zeros) which indicates slope overload. The presence of coincidence is reported by a logic one signal on a line 72 to one input of the CVSD syllabic filter 74, another input of which receives the 56 KHz clock signal on line 28.

As described hereinafter the syllabic filter provides the algorithm for control of the ADM quantization step amplitude as a function of the voice signal average slope; the slope value is indicated by the presence of sample bit coincidence. A unipolar quantization step voltage signal is provided at the syllabic filter output on line 76 to a polarity switch 78 which polarizes the quantization step signal in each ADM sample period in dependence on the ADM sample bit logic state. The polarized step voltage signal is provided on line 80 to the encoder/decoder integrating filter 82. The filter preferably has two poles and a zero and is realized as the cascade connection of two first order (single pole) sections; e.g. two integrators. The output from the encoder filter is the encoded analog voice signal equivalent and is provided on the analog signal output line 33 which, for the encoder function, is connected back through interconnect 84 (shown in phantom) to the noninverting input 62 of the comparator. In the decoder function without interconnect 84) the input 62 is connected to a digital bias signal source 86 (shown in phantom), which sets the ADM switching threshold for the comparator.

Figure 1:
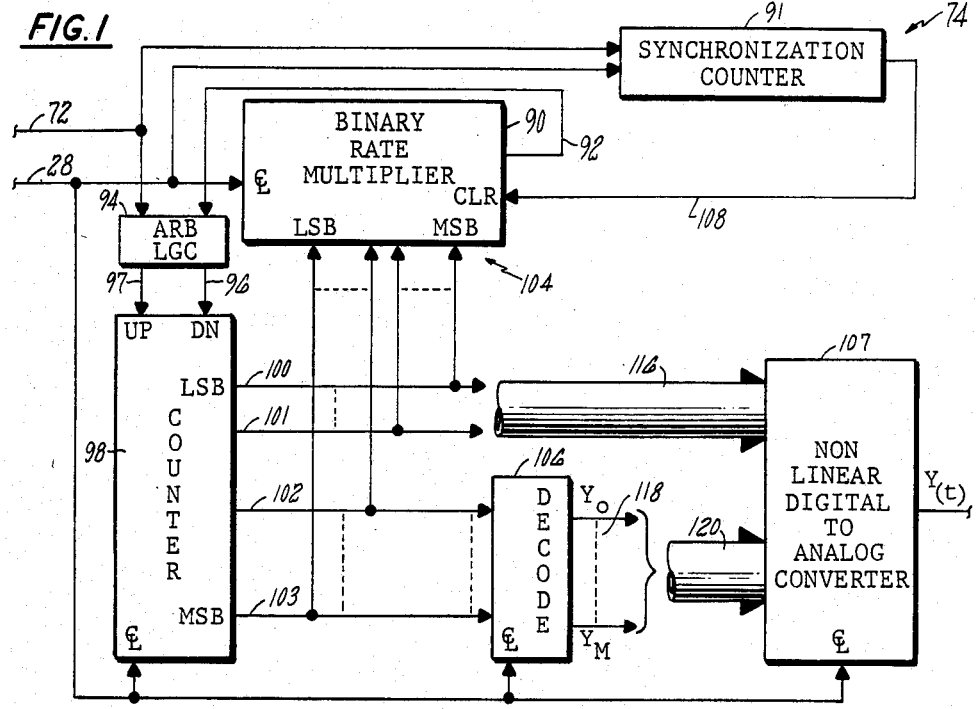
FIG. 1 is a system block diagram of an ADM CODEC syllabic filter according to the present invention.

Referring now to the FIG. 1 block diagram of the syllabic filter 74, in a PBX embodiment the encoder/decoder ADM bits are clocked at 56 KHz; the clock period (ADM bit time) is approximately 17.8 microseconds. The clock signal (line 28) is presented to clock inputs of a binary rate multiplier 90 and synchronization counter 91. The multiplier, which receives an input binary count (described hereinafter) provides a countdown signal on line 92 which is presented, together with the coincidence state signal on line 72, through arbitration logic circuitry 94, to the DOWN (DN) and UP inputs 96, 97 of a $2^N$ bit binary counter 98. Each signal causes the counter to provide the associated upcount or downcount signal on lines 100–103 (least significant bit (LSB) through most significant bit (MSB)). The counter output referred to as the syllabic count, is presented as the input binary count to the signal input 104 of the binary rate multiplier and to the syllabic algorithm embodied in binary decode 106 and nonlinear digital-to-analog converter (DAC) 107.

The binary rate multiplier countdown signal on line 92 is proportional to the product of the line clock signal and the multiplier's selected duty cycle. The duty cycle instantaneous value varies linearly with the instantaneous syllabic count value on lines 100-103 (input 104), up to a selected maximum at the maximum $2^N$ syllabic count. For a selected maximum duty cycle of 25% (corresponding to an input binary signal count of 127) the line 92 countdown signal is a maximum one out of four clock pulses.

The synchronization counter 91 aligns the timing of the downcounts of the binary rate multipliers in the decoder and associated encoder of a common CODEC, to provide a better signal to noise (S/N) ratio. This is accomplished by counting the number of consecutive coincidences on line 72. If that number reaches a selected maximum (e.g. sixteen consecutive coincidences) the counter provides a reset signal on line 108 to the multiplier. As a result, the multiplier of the decoder will have the same state as that of the encoder relative to the encoded bit stream.

Figure 5:
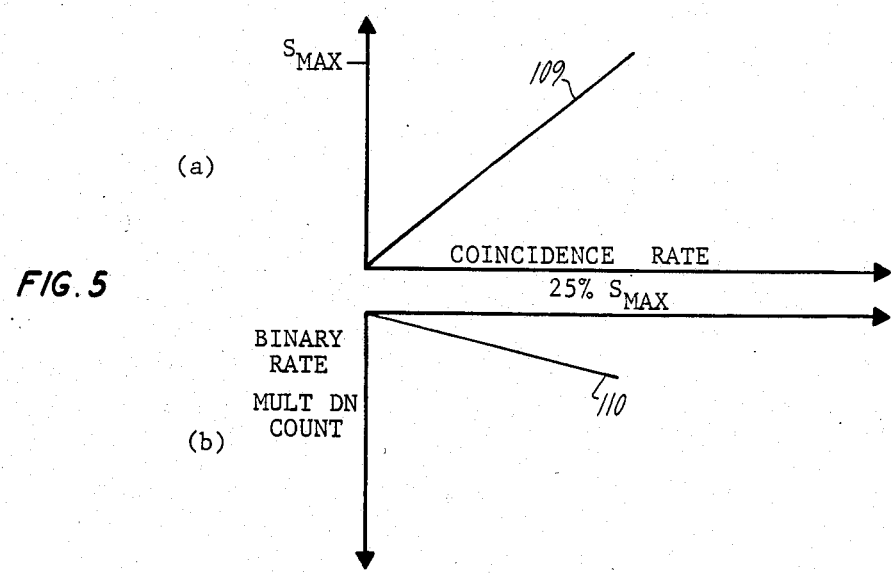
FIG. 5 is an illustration of a set of waveforms used in the description of the present invention.

In the operation of the rate multiplier and UP/DN counter, the relationship between the syllabic count and coincidence state signal is linear, as shown by the phantom waveform 109 of FIG. 5. Similarly, since the rate multiplier duty cycle increases with increasing syllabic count as a result of coincidence, the actual transfer function between the rate of down counts and syllabic count is also linear, as shown by the waveform 110. Whereas the syllabic count increases by one in the presence of each detected coincidence state, it counts down at a rate proportional to its own (syllabic count) value. This is provided by the combination binary rate multiplier and syllabic counter 98, and is the digital signal analog of a resistor-capacitor (RC) integrator characteristic, in which the binary rate multiplier output signal provides the "leaky integrator" effect. This forces the syllabic count towards zero in the absence of coincidence, i.e. absence of slope overload, which allows proper tracking of the input voice signal and reduces quantization noise. In addition it minimizes D.C. offset errors between encoder and decoder voice equivalent signals. FIG. 6 shows the change in syllabic count 112 (illustration (d)) as a function of coincidence 113 (illustration (c)), binary rate count 114 (illustration (b)), and clock signal 115 (illustration (a)). The binary rate multiplier duty cycle is an assumed 25% maximum for a $2^7$ (128) syllabic count maximum.

As shown in FIG. 1, the syllabic count lines 100-103 are presented in two separate groups to the DAC 107. A first group comprising a selected number of lesser significant bits as represented by lines 100-101 are presented directly through lines 116 to the DAC. A second group containing the remaining, more significant bits are presented through the binary state decoder which provides state decode signals ($Y_O$-$Y_M$) at an output 118, which are presented through lines 120 to the DAC.

Figure 4:
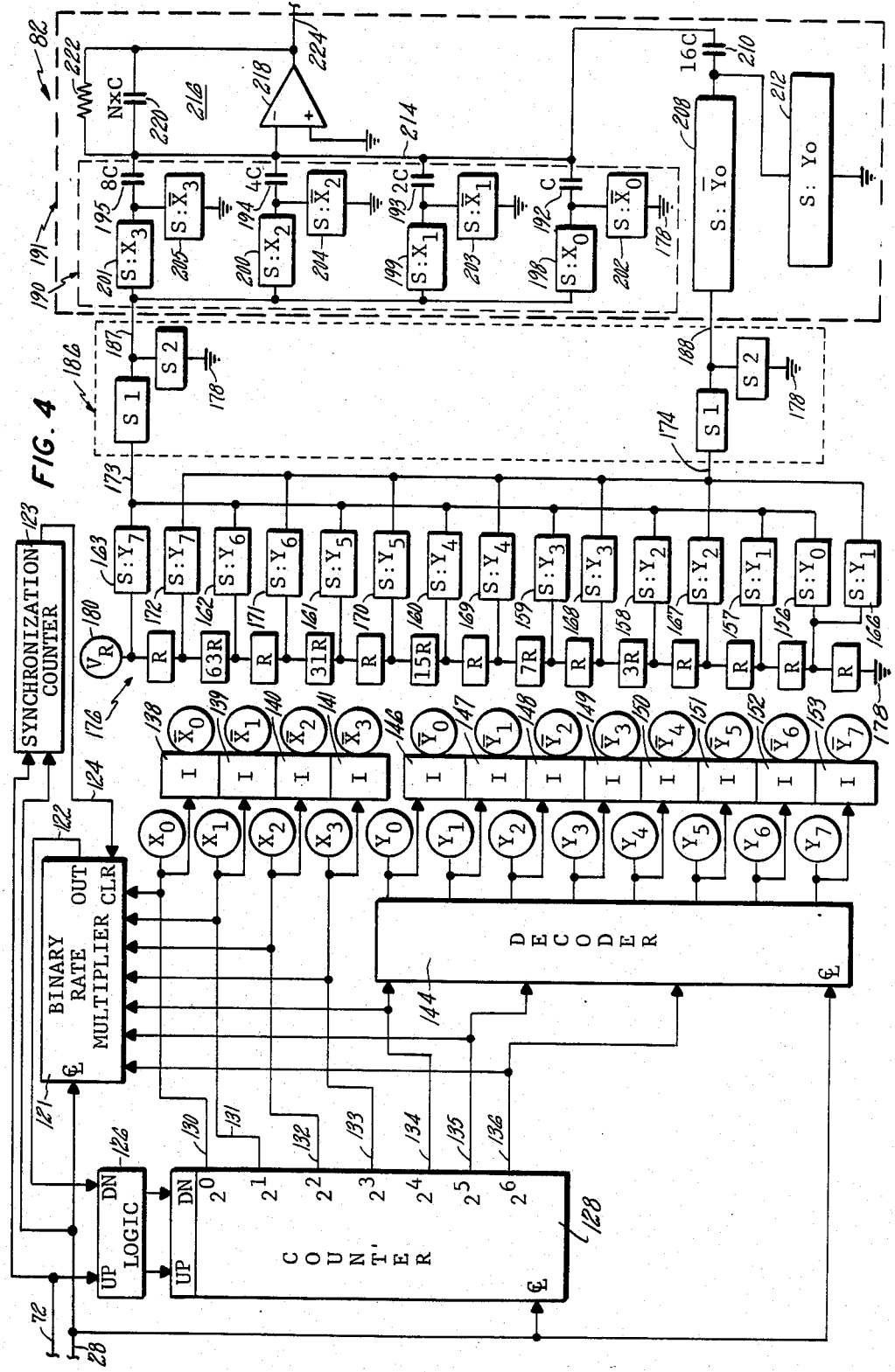
FIG. 4 is a schematic diagram of a preferred embodiment of the syllabic filter of FIG. 1 for use in the CODEC of FIG. 3.

FIG. 4 illustrates a particular embodiment of the syllabic filter 74 of FIG. 1; specifically a hybrid embodiment combining the polarity switch and filter input stage as part of the nonlinear DAC. As in FIG. 1, the embodiment of FIG. 4 includes a binary rate multiplier 121 providing an output rate signal on line 122, together with synchronization counter 123 which provides the line 129 reset of the multiplier for a selected max number of consecutive coincidences on line 72. The rate signal is presented with the line 72 coincidence signal through arbitration logic circuitry 126 to the DN and UP inputs of an UP/DN counter 128. In FIG. 4 the syllabic count is seven bits with a max count equal to 127. The four least significant bits ($2^0$-$2^3$) on lines 130-133 are the first group of syllabic lines and the more significant bits ($2^4$-$2^6$) on lines 134-136 are the second group. The least significant bits ($X_0$-$X_3$) are presented to associated INVERT (I) gates 138-141 which provide the inverted signals ($\overline{X}_0$-$\overline{X}_3$). The more significant bits on lines 134-136 are decoded into eight state signals ($Y_0$-$Y_7$) through decoder 144, and each are presented to INVERT gates 146-153 which provide inverted state signals ($\overline{Y}_0$-$\overline{Y}_7$).

Figure 7:
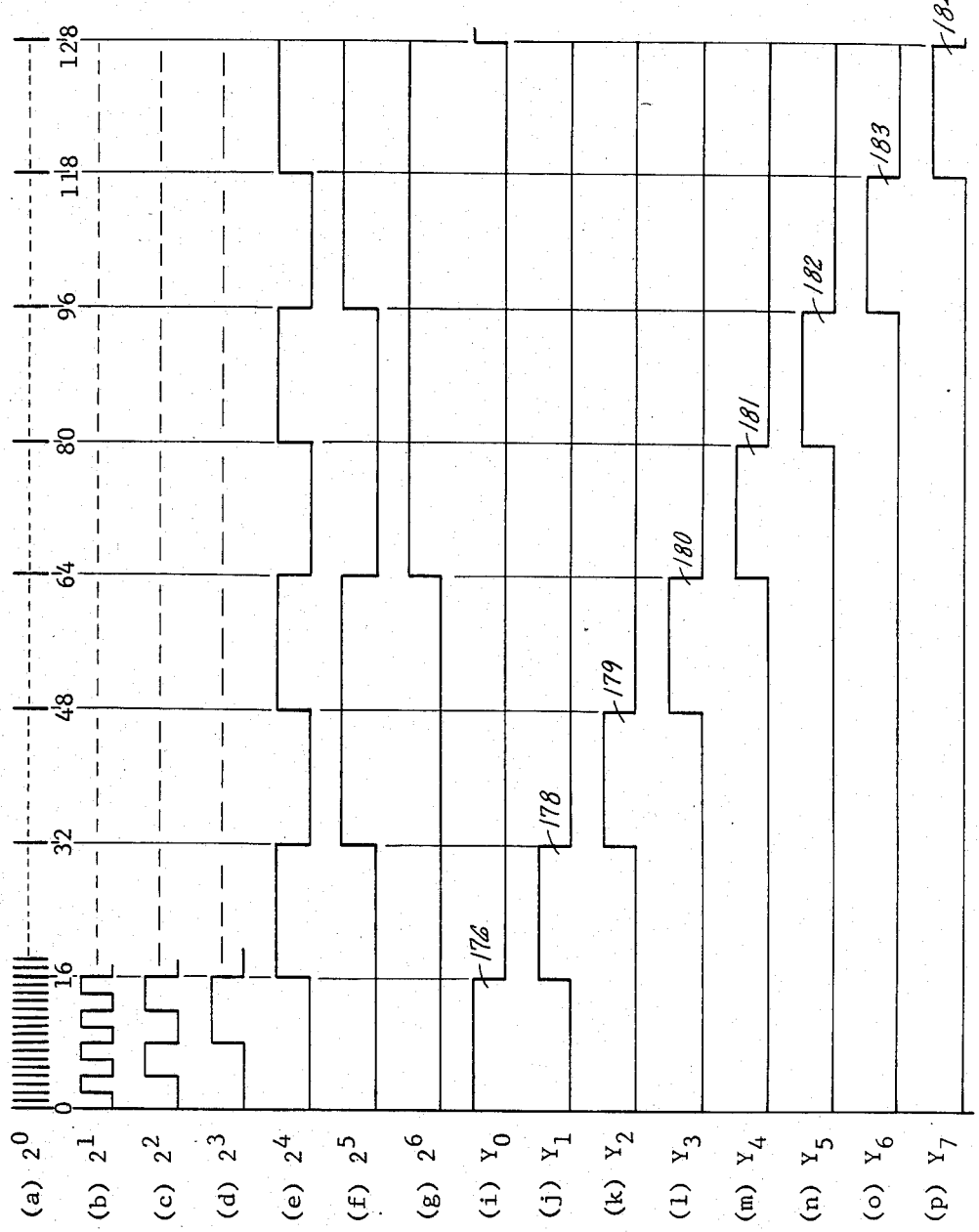
FIG. 7 is an illustration of still another set of waveforms used in the description of the present invention.

The Y decoded state signals, or segment signals $Y_0$-($\overline{Y}_0$)-$Y_7$($\overline{Y}_7$), change states sequentially on each sixteen count cycle of the X decoded state bits $X_0$-$X_3$ (FIG. 7). The segment signals control two sets of voltage controlled gate switches, such as MOS FETs; a first set 156-163 and a second set 166-172. The switches in each set are each connected at one end to a different junction of a series resistive network 176, which itself is connected between signal ground 178 and a reference voltage signal ($V_R$) source 180. The opposite side of the switches in the same set are connected to a common switch set output line; line 173 for the first set and line 174 for the second set.

The series resistive network is a series of resistor elements having discrete values ranging from R to 63R. The values are selected to provide a binary weighted progression of voltage value connections to the first switch set, from switch 156 to the last switch 163. The second switch set is similarly connected, from switch 166 through switch 172. With the exception of the first connection the two sets are offset by one R value. As will later become apparent, the Y decode value determines the one of eight segments of a present syllabic count, and it selects the R ladder voltage value presented to line 173. This line 173 voltage is then broken up into sixteen equal parts (quantized) and added to the voltage on line 174 (the base value) which together form the output signal.

For the seven bit embodiment the syllabic count varies from zero to 127; 128 count intervals over which the quantization step amplitude increases from a selected minimum value to 100% of step amplitude. The 128 syllabic count is divided into eight segments of 16 counts each. Each segment is marked by a related one of the eight state decode signals (segment signals) from decoder 144 each of which actuate a related one of the eight switches of the first set (156-163). The 16 count interval within each segment is provided by decoding the four least significant bits $2^0$-$2^3$ ($X_0$-$X_3$).

FIG. 7, illustrations (a)-(g) show the seven bit syllabic count output from the counter 128. The decoded state signals from the decoder 144 are shown in illustrations (i)-(p) as segment signals 176-184 corresponding to the state signals $Y_0$-$Y_7$. In the first 16 count interval segment signal 176 ($Y_0$) is at a logic one actuating switch 156 which results in a line 173 output voltage $$e(t) = \frac{R}{128R} \cdot V_R.$$

This represents the minimum resistive network output voltage and is referred to as unit voltage V. Each succeeding segment network output voltage is a binary multiple of the unit voltage value so that in the count interval 16-31 segment signal 178 ($Y_1$) actuates switch 157 to provide a line 173 output voltage $$e_{(t)} = \frac{R}{64R} \cdot V_R = 2 \cdot V$$

and switch 166 provides a line 174 voltage signal V. In segments 179-184 switches 158-163 are actuated in turn to provide a 173 output voltage which increases in amplitude in a binary weighted manner, as shown in Table I. The line 174 output also increases in an essentially binary manner over seven segments ($Y_1$-$Y_7$).

TABLE I

| SEGMENT | LINE 173 | LINE 174 |
|---------|----------|----------|
| $Y_0$ | V | 0 |
| $Y_1$ | 2 V | V |
| $Y_2$ | 4 V | 3 V |
| $Y_3$ | 8 V | 7 V |
| $Y_4$ | 16 V | 15 V |
| $Y_5$ | 32 V | 31 V |
| $Y_6$ | 64 V | 63 V |
| $Y_7$ | 128 V | 127 V |

The network output voltage signals on lines 173, 174 are presented through polarity switch 186 to the switch output lines 187, 188. Line 187 is connected to a binary weighted capacitor array 190 which, in the embodiment of FIG. 4 comprises a portion of the input section of the first stage 191 of the dual stage encoder/decoder filter (82, FIG. 2). The array includes four capacitive elements 192-195, each at a value which is a multiple of a unit capacitive value C. In the FIG. 4 embodiment the array is four bits wide and the capacitor values increase in a binary manner from a capacitor 192 value of C through values 2C, 4C, and 8C for elements 193-195. Each of the capacitors are electronically connected, alternately, to line 187 and to signal ground 178 by gate actuated switches 198-201 and 202-205, respectively. As shown, the switches are arranged in pairs; the switches in each pair being actuated by the opposite logic state of the pair associated bit signals $X_0$-$X_3$. For example, switches 198, 202 form one pair and switch 198 is actuated by a logic one $X_0$ signal to electrically connect capacitor 192 to line 187 while switch 202 is actuated by $\overline{X}_0$ to connect the capacitor to signal ground. This arrangement is repeated for each switch pair so that the binary array is connected to the network in binary sequence.

The individual array capacitors are charged and discharged in units of charge Q; the product of the ladder unit voltage and array capacitor values, or Q=V.C. As known, the polarity switch 186, simply illustrated with two sets of function switches S1, S2, puts charge to or pulls charge from the array capacitors in dependence on the difference signal polarity. The particular array capacitor charged or discharged is determined by the X state. At $X_0$ (segment number 1) capacitive element 192 is charged (discharged) by Q. At $X_1$ capacitive element 193 is charged (discharged) by 2Q, and so on in increasing multiples of Q. The instantaneous line 187 voltage value multiplied by the instantaneous capacitive element being switched, determines the instantaneous charge on the array. During the associated NOT state of the X signal the capacitors discharge to ground.

The voltage on the line 188 from the network's second set of switches is presented through gated switch 208, which is actuated by the NOT $Y_0$ term, to a 16C capacitive element 210 which is connected on the same side through switch 212 to signal ground. The charge on capacitor 210 is the base charge from the previous segments, i.e. it is the integral of the instantaneous segment value of the syllabic count. As such it marks each syllabic count segment and is referred to as the segment capacitor. The capacitive elements 192-195, 210 are connected on the other end to bus 214; the inverting input of an integrator 216 which includes operational amplifier 218, feedback capacitor 220, and feedback resistor 222; the integrator integrates the input charge signals and presents the integral signal on line 224 to the second stage of the encoder filter.

Appendix A tabulates the total charge Q on bus 214 as a function of syllabic count, the output from capacitor array 190, and the segment capacitor 210 which together provide the total Q for each syllabic count value. As shown, the change in Q, i.e. ΔQ, increases in a binary manner. In segment No. 1 ΔQ is one; in segment No. 2 ΔQ is 2, and so on with successive segments having ΔQ values of 4, 8, 16, 32, 64, and 128. The binary progression of ΔQ values is provided by the binary weighting of the resistive network. The four bit binary weighted capacitor array provides the linear sixteen step increments in each segment. As shown, with increasing syllabic count and increasing Q, there is an increasing rate of change of Q, e.g. ΔQ increases. As such, the algorithm increases the quantization step amplitude more rapidly in the presence of successive sample bit coincidence. At low syllabic count the rate of change is low to allow only small incrementing of step amplitude. The rate of change is, therefore, directly proportional to the setting of the step amplitude and is equal at any time to the product of a constant multiplied by the instantaneous algorithm output value.

Figure 8:
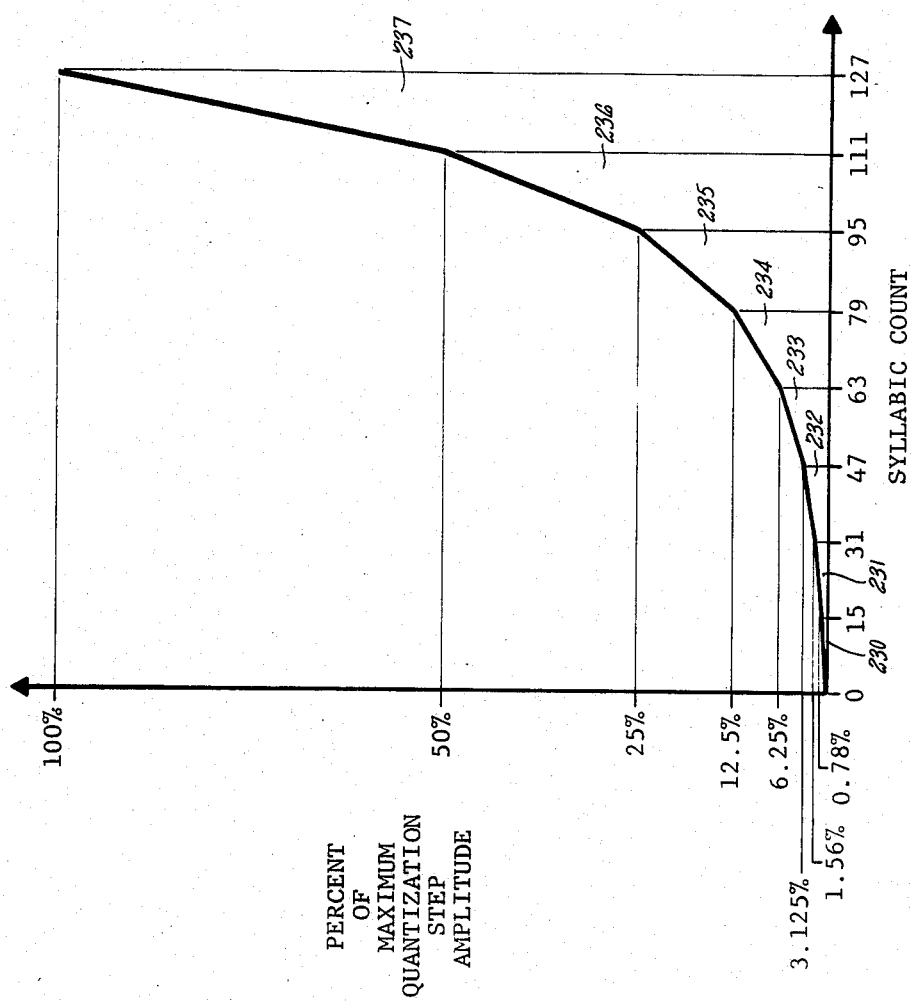
FIG. 8 is an illustration of the syllabic filter algorithm of the CVSD encoder of the present invention.

FIG. 8 illustrates the syllabic algorithm, the results of which are tabulated in Appendix A. There are eight segments 230-237 in the best mode embodiment. It should be understood, however, that the embodiment is a piece wise approximation of the algorithm such that greater or fewer number of segments may be provided as may be decided by those skilled in the art. Each segment is divided into 16 linear intervals corresponding to associated syllabic count values, e.g. segment 230 associated with count values 0-15, segment 231 with count values 16-31. and so on. The maximum syllabic count is 127. The ordinate shows the percentage of maximum quantization step amplitude; from 0 to 100 percent. The step amplitude increases in each segment in binary progression. The first segment (230) provides a maximum 0.78% of max amplitude. The second segment (231) provides a maximum of 1.56%, and so on through percentage values of 3.125%, 6.25%, 12.5%, 25%, 50%, and 100%.

The step amplitude percent values varies with each segment (N) as $F = P \cdot 2^N$; where P is the smallest percent step amplitude (0.78% for the first segment). The rate of change of step amplitude is equal to the first derivative $dF/dN = (\ln 2) \cdot P \cdot 2^N$. Since the natural log of two (ln2) is a constant (0.693), the rate of step change is the product of a constant (ln2) multiplied by the function ($P \cdot 2^N$) itself. This is the characteristic of the syllabic filter algorithm of the present invention. In other words, the rate of change quantization step amplitude at any given syllabic count value (f(S)) is proportional (K·f(S)) to the value of the function itself. In the present embodiment exponential powers of base 2 are used, however, various other bases may be used, other than binary, to provide any base number, including the natural base e (i.e. $e^N$).

With the absence of coincidence (i.e. slope overload) the syllabic count decreases directly with the output from the binary rate multiplier (BRM) as shown in FIG. 6, illustration (b)-(d). The step amplitude similarly decreases with decreasing count in accord with the algorithm of the nonlinear DAC, e.g. FIG. 8. Since the BRM duty cycle decreases linearly with actual syllabic count value, the syllabic count to the DAC itself decreases exponentially.

As known, the BRM "leaky integrator" function constantly forces the quantization step amplitude towards zero. This minimizes DC offset errors between encoders/decoders of different CODECs (e.g. telephone sets), preventing voice signal saturation and distortion.

With the ADM CODEC of the present invention the syllabic filter allows for minimum quantization and slope overload noise, therefore providing significantly higher S/N ratios for small difference signal magnitudes. The exponential syllabic filter transfer function provides a present rate of change in quantization step amplitude which is directly proportional to the present step amplitude; increasing and/or decreasing in only small amounts for small step amplitudes and conversely increasing and/or decreasing by large increments for large difference signal magnitudes. Similarly, although the invention has been shown and described with respect to a preferred embodiment thereof, it should be understood by those skilled in the art that various other changes and omissions in the form and detail thereof, may be made therein, without department from the spirit and scope of the invention.

APPENDIX A

| Syllabic Count | 4 Bit Binary Capacitor Array | Segment Capacitor | Total Charge Q | Segment |
|---|---|---|---|---|
| 0 | 0 | 0 | 0 | No. 1 |
| 1 | V.C | 0 | Q | |
| 2 | V.2 C | 0 | 2 Q | |
| . | . | . | . | |
| 15 | V.15 C | 0 | 15 Q | — |
| 16 | 0 | V.16 C | 16 Q | No. 2 |
| 17 | 2 V.C | . | 18 Q | |
| 18 | 2 V.2 C | . | 20 Q | |
| . | . | . | . | |
| 31 | 2 V.15 C | V.16 C | 46 Q | — |
| 32 | 0 | 3 V.16 C | 48 Q | No. 3 |
| 33 | 4 V.C | . | 52 Q | |
| . | . | . | . | |
| 47 | 4 V.15 C | 3 V.16 C | 108 Q | — |
| 48 | 0 | 7 V.16 C | 112 Q | No. 4 |
| 49 | 8 V.C | . | 120 Q | |
| 50 | 8 V.2 C | . | 128 Q | |
| . | . | . | . | |
| 63 | 8 V.15 C | 7 V.16 C | 232 Q | — |
| 64 | 0 | 15 V.16 C | 240 Q | No. 5 |
| 65 | 16 V.C | . | 256 Q | |
| 66 | 16 V.2 C | . | 272 Q | |
| . | . | 15 V.16 C | . | |
| 79 | 16 V.15 C | 15 V.16 C | 480 Q | — |
| 80 | 0 | 31 V.16 C | 496 Q | No. 6 |
| 81 | 32 V.C | . | 528 Q | |
| 82 | 32 V.2 C | . | 560 Q | |
| . | . | . | . | |
| 95 | 32 V.15 C | 31 V.16 C | 976 Q | — |

APPENDIX A-continued

| Syllabic Count | 4 Bit Binary Capacitor Array | Segment Capacitor | Total Charge Q | Segment |
|---|---|---|---|---|
| 96 | 0 | 63 V.16 C | 1008 Q | No. 7 |
| 97 | 64 V.C | . | 1072 Q | |
| 98 | 64 V.2 C | . | 1136 Q | |
| . | . | . | . | |
| 111 | 64 V.15 C | 63 V.16 C | 1981 Q | — |
| 112 | 0 | 127 V.16 C | 2032 Q | No. 8 |
| 113 | 128 V.C | . | 2160 Q | |
| 114 | 128 V.2 C | . | 2288 Q | |
| . | . | . | . | |
| 127 | 128 V.15 C | 127 V.16 C | 3952 Q | — |

I claim:

1. A syllabic filter for changing the amplitude of a voice approximation signal provided by a continuously variable slope delta modulation (CVSD) codec in each sample interval, by an amount proportional to a difference magnitude between the voice approximation signal and an actual voice signal received by the codec, as indicated by the coincidence of a first logic state of a coincidence signal bit provided by the codec in successive sample intervals, the filter comprising:

counter means, responsive to the coincidence signal bit and to a binary rate signal bit, for providing a syllabic signal having a syllabic count in each sample interval between a minimum count, corresponding to low coincidence of the coincidence bit first logic state, and a maximum count corresponding to a high coincidence thereof, said syllabic count increasing by one in the presence of the coincidence signal bit first logic state and decreasing by one in the presence of a first logic state of said binary rate signal bit, said count remaining constant in the simultaneous presence and, alternately, in the simultaneous absence of the coincidence signal bit first logic state and said binary rate signal bit first logic state;

binary rate multiplier means, for providing said binary rate signal bit first logic state to said counter means, periodically, at a variable frequency which increases with an increasing syllabic count value;

signal decode means, for decoding said syllabic count into first and second state signals in each sample interval, said first state signal identifying a highest whole range exceeded by said syllabic count from among a plurality of sequential, equal increment syllabic count value ranges between said minimum value and said maximum value, said second state signal identifying the incremental syllabic count value above the highest whole range identified by said first state signal;

first converter means, for providing a first analog signal in each sample interval at an amplitude proportional to said highest whole range identified by said first state signal, said first converter means increasing said first analog signal amplitude, nonlinearly, in increasingly greater magnitude increments and, alternately, decreasing said first analog signal amplitude in increasingly lesser magnitude increments, in succeeding sample intervals, in response to said first state signal indicating a highest whole range which is higher or lower, respectively, in said sequence of value ranges;

second converter means, for providing a second analog signal in each sample period at an amplitude proportional to said incremental syllabic count value identified by said second state signal, and for changing said second analog signal amplitude linearly, upward and downward, in response to said second state signal indicating a higher syllabic count value and a lower syllabic count value, respectively; and integrator means, for adding said first analog signal amplitude to said second analog signal amplitude in each sample period period, to provide the sum signal amplitude thereof as the codec voice approximation signal amplitude.

2. The syllabic filter of claim 1, further comprising:

synchronization circuit means, responsive to the coincidence signal bit and to a codec clock signal, for providing a synchronization reset signal to said binary rate multiplier to periodically reset the output thereof in response to the presence of the first logic state of the coincidence signal bit in consecutive sample intervals.

3. A continuously variable slope delta modulation (CVSD) encoder, for providing adaptive delta modulation (ADM) encoding of a received analog voice signal into a series ADM signal having a binary ADM sample bit in each of successive sample intervals of the encoder, comprising:

comparator means, for comparing the received analog voice signal amplitude with that of a voice approximation signal, to provide each ADM sample bit in a first logic state and, alternately, in a second logic state in response to said approximation signal being greater than or less than the received analog voice signal;

coincidence detector means, responsive to each ADM sample bit for detecting reoccurrence of a same ADM logic state in successive sample intervals, and for presenting a coincidence signal bit in a first logic state on each said reoccurrence;

syllabic filter means, including counter means, responsive to the coincidence signal bit and to a binary rate signal bit, for providing a syllabic signal having a syllabic count in each sample interval between a minimum count, corresponding to low coincidence of the coincidence bit first logic state, and a maximum count corresponding to a high coincidence thereof, said syllabic count increasing by one in the presence of the coincidence signal bit first logic state and decreasing by one in the presence of a first logic state of said binary rate signal bit, said count remaining constant in the simultaneous presence and, alternately, in the simultaneous absence of the coincidence signal bit first logic state and said binary rate signal bit first logic state;

binary rate multiplier means, for providing said binary rate signal bit first logic state to said counter means, periodically, at a variable frequency which increases with an increasing syllabic count value;

signal decode means, for decoding said syllabic count into first and second state signals in each sample interval, said first state signal identifying the highest whole range exceeded by said syllabic count from among a plurality of sequential, equal increment syllabic count value ranges between said minimum value and said maximum value, said second state signal identifying the incremental syllabic count value above the highest whole range identified by said first state signal;

first converter means, for providing a first analog signal in each sample interval at an amplitude proportional to said highest whole range identified by said first state signal, said first converter means increasing said first analog signal amplitude, non-linearly, in increasingly greater magnitude increments and, alternately, decreasing said first analog signal amplitude in increasingly lesser magnitude increments, in succeeding sample intervals, in response to said first state signal indicating a highest whole range which is higher or lower, respectively, in said sequence of value ranges;

second converter means, for providing a second analog signal in each sample period at an amplitude proportional to said incremental syllabic count value identified by said second state signal, and for changing said second analog signal amplitude linearly, upward and downward, in response to said second state signal indicating a higher syllabic count value and a lower syllabic count value, respectively; and integrator means, for adding said first analog signal amplitude to said second analog signal amplitude in each sample period period, to provide the sum signal amplitude thereof as said voice approximation signal amplitude.

4. The encoder of claim 3, further comprising:

synchronization circuit means, responsive to the coincidence signal bit and to an encoder clock signal, for providing a synchronization reset signal to said binary rate multiplier to periodically reset the output thereof in response to the presence of the first logic state of the coincidence signal bit in consecutive sample intervals.

* * * * *